United States Patent [19]

Carbaugh, Jr. et al.

[11] Patent Number: 5,726,568
[45] Date of Patent: Mar. 10, 1998

[54] MAGNETO-REPULSION PUNCHING WITH DYNAMIC DAMPING

[75] Inventors: William Dale Carbaugh, Jr., Greencastle, Pa.; Mark Joseph LaPlante, Walden, N.Y.; David Clifford Long, Wappingers Falls, N.Y.; Karl Friedrich Stroms, Las Vegas, Nev.; Christopher David Setzer, Wappingers Falls, N.Y.

[73] Assignee: International Business Machines Corporation, Armonk, N.Y.

[21] Appl. No.: 482,395

[22] Filed: Jun. 7, 1995

[51] Int. Cl.$^6$ .................................................. G01B 7/00
[52] U.S. Cl. .............................. 324/207.16; 324/207.26; 324/207.22; 83/575
[58] Field of Search ........................... 83/62.1, 72, 74, 83/575, 576, 577; 173/210; 318/114, 115, 119, 120, 127, 129; 388/937; 101/93.02, 93.28, 93.29; 324/207.24, 207.26, 207.17, 665, 207.16, 655, 207.15, 654, 656, 207.22; 340/644

[56] References Cited

U.S. PATENT DOCUMENTS

| | | |
|---|---|---|
| 2,825,406 | 3/1958 | Hagopian . |
| 3,602,806 | 8/1971 | Czekajewski ................ 324/40 |
| 3,611,138 | 10/1971 | Winebrener ................ 324/173 |
| 3,678,847 | 7/1972 | Pear, Jr. et al. . |
| 3,695,130 | 10/1972 | Fedrigo . |
| 3,730,039 | 5/1973 | Fedrigo . |
| 3,867,675 | 2/1975 | Kitz et al. ................ 318/119 |
| 4,001,687 | 1/1977 | Sorkin et al. ................ 324/173 |
| 4,068,189 | 1/1978 | Wilson ................ 331/65 |
| 4,121,155 | 10/1978 | Chamuel ................ 324/207 |
| 4,333,052 | 6/1982 | Schmall ................ 324/208 |
| 4,333,398 | 6/1982 | Carson, Jr. et al. . |
| 4,348,119 | 9/1982 | Carson, Jr. et al. . |
| 4,353,656 | 10/1982 | Sohl et al. . |
| 4,395,665 | 7/1983 | Buchas ................ 318/114 |
| 4,429,342 | 1/1984 | Heider . |
| 4,522,122 | 6/1985 | Mazumder . |
| 4,538,930 | 9/1985 | Dunfield . |

(List continued on next page.)

FOREIGN PATENT DOCUMENTS

| | | |
|---|---|---|
| 0293257 | 11/1988 | European Pat. Off. . |
| 60-261352 | 12/1985 | Japan . |

OTHER PUBLICATIONS

"Magneto Repulsion Punch Drive Circuit"; IBM Technical Disclosure Bulletin; vol. 31, No. 7, Dec. 1988; pp. 423–424.
"Flexpunch Machine"; IBM Technical Disclosure Bulletin; vol. 31, No. 9, Feb. 1989; pp. 140–141.
"Punch Design for Magnetic Punch"; IBM Technical Disclosure Bulletin; vol. 32, No. 58, Oct. 1989; pp. 205–206.

*Primary Examiner*—Rinaldi I. Rada
*Assistant Examiner*—Boyer Ashley
*Attorney, Agent, or Firm*—Whitham, Curtis, Whitham & McGinn; Aziz M. Ahsan

[57] ABSTRACT

Dimpling of a workpiece by rebounding of a magnetic repulsion punch mechanism, when operated at high punching rates, is avoided by application of a damping pulse at a point at or subsequent to a mid-point of a return stroke of the punch from the workpiece and preferably within the last 10% of the return stroke. This damping pulse is preferably a fraction of the pulse width and of approximately the same amplitude as a driving pulse applying kinetic energy to the punch for causing punching of the workpiece. At high punching rates the kinetic energy of the return portion of a punching stroke is substantially determined by elastic rebounding of the punch from a guide bushing. The removal of kinetic energy during the return portion of the stroke allows the return of the punch to a position close to a rest position during a very short interval with small overshoot under control of mechanical damping. Since dynamic damping may be substituted for much of the mechanical damping in the punching arrangement, high quality punching may be accomplished at much increased punching rates. A preferred form of monitoring punch position employs RF reflected inductance and may be used to form a time expanded image of punch movement.

3 Claims, 7 Drawing Sheets

U.S. PATENT DOCUMENTS

| | | |
|---|---|---|
| 4,543,527 | 9/1985 | Schuchmann et al. ............... 324/207 |
| 4,547,087 | 10/1985 | Heider et al. . |
| 4,553,074 | 11/1985 | Jacquemet . |
| 4,569,607 | 2/1986 | Takemoto . |
| 4,599,007 | 7/1986 | Khorsand . |
| 4,618,822 | 10/1986 | Hansen ............... 324/207 |
| 4,703,644 | 11/1987 | Waldner . |
| 4,744,684 | 5/1988 | Maekawa . |
| 4,821,614 | 4/1989 | Fleet et al. . |
| 4,850,724 | 7/1989 | Fattori . |
| 4,857,919 | 8/1989 | Braswell ............... 340/870.36 |
| 4,862,043 | 8/1989 | Zieve . |
| 4,871,271 | 10/1989 | Watanabe et al. . |
| 4,872,381 | 10/1989 | Stroms . |
| 4,880,322 | 11/1989 | Jensen et al. . |
| 4,990,805 | 2/1991 | Zieve . |
| 5,003,260 | 3/1991 | Auchterlonie ............... 324/207.16 |
| 5,010,298 | 4/1991 | Uemura ............... 324/207.19 |
| 5,019,782 | 5/1991 | Schatter ............... 324/655 |
| 5,159,253 | 10/1992 | Shimizu et al. ............... 318/606 |
| 5,222,012 | 6/1993 | Frankeny et al. ............... 361/156 |
| 5,291,782 | 3/1994 | Taylor ............... 73/319 |
| 5,404,101 | 4/1995 | Logue ............... 324/207.17 |
| 5,410,233 | 4/1995 | Carbaug, Jr. et al. . |
| 5,453,871 | 9/1995 | Kolner et al. ............... 359/238 |
| 5,467,082 | 11/1995 | Sanderson ............... 340/825.54 |
| 5,479,172 | 12/1995 | Smith et al. ............... 342/51 |

PUNCH POSITION VS/TIME

PUNCH POSITION VS/TIME

5,726,568

MAGNETO-REPULSION PUNCHING WITH DYNAMIC DAMPING

BACKGROUND OF THE INVENTION

1. Field of the Invention

The present invention generally relates to the formation of apertures in sheet material by punching and, more particularly, to the monitoring and control of punching tools operated at high speed, especially as used in the fabrication of electronic circuit components.

2. Description of the Prior Art

The manufacture of many articles involves the formation of apertures therein. In particular, it has been the common practice in the construction of electrical and electronic devices to mount components on a perforated, insulating board or other substrate by passing leads through apertures in the board. In such a case, connections are often formed by a conductive metal pattern on the board and also by wiring passed through the board, as in constructions involving the well-known printed circuit.

In recent years, electronic circuits and devices of greatly increased complexity have been fabricated with multiple layers. One such type of device is the multi-layer module (MLM) which employs a large number of insulative layers to separate numerous conductive patterns. The respective conductive patterns may be selectively connected at holes formed in the insulative layers, commonly referred to as vias.

A particular form of MLM is the multi-layer ceramic (MLC) device in which the insulative layers are initially formed of an uncured ceramic, referred to as a green sheet. Conductive patterns are formed thereon by screening of a conductive paste onto a surface of the green sheet with a stencil or mask. Vias may be filled in the same manner or even in the same screening operation. After the conductive patterns are formed on the respective green sheets, the green sheets are assembled into an accurately registered stack and sintered under pressure to cure the ceramic and form the complete interconnection arrangement embedded therein.

Of course, in such structures, the vias are extremely small and very numerous in each of the 20 to 100 or more green sheets which may be present in a single device. This is particularly true for so-called distribution layers which serve to change the nominal conductive feature spacing in the so-called connection layers to a size and spacing (e.g. pitch) compatible with integrated circuits which are mounted thereon. Therefore, the apertures which form the vias must be accurately positioned and must be of very accurate geometry. To achieve this accuracy, a punch is generally used to form the vias. A punch is also desirable because the material from the punched hole will be of a relatively large particle size in comparison with other methods which cut or erode material from the aperture. Such material can be a source of contamination of the green sheet during further processing and larger particle size facilitates control thereof.

A punch apparatus must be very large in comparison to the holes formed in order to develop the force necessary to successfully and cleanly punch through the material (e.g. green sheet). The machining of punches to form multiple holes in a single stroke is more expensive than single hole punches. Further, the results obtained from multiple hole punches are generally inferior to the hole quality obtained with a single hole punch in terms of geometric accuracy and positioning accuracy. However, if a single hole punch is used, the number of holes which must be formed in each green sheet dictates that the punch apparatus be operated a very high speed in order to achieve acceptable throughput during manufacturing processes.

Since such punches are mechanical devices, although generally operated by electrical systems, accuracy may be compromised at higher speeds where mechanical limitations are encountered due to high acceleration and deceleration forces and the geometry of the punch mechanism. In particular, when the velocity of the punch is increased, the reciprocating portion of the punch may strike other portions of the punch structure at the ends of the punching stroke and elastically rebound therefrom. Such rebounding is essentially an uncontrolled motion of the punch and, if severe, may cause unintended contact between the punch and the workpiece. At the high accuracies required in MLC structures, such contact will almost invariably cause significant damage to the green sheet as dimples in the green sheet surface which will affect the manufacturing yield of the devices made.

Since the length of the punch stroke must be limited for use at high punching rates and accuracies, uncontrolled motion due to rebounding is a substantial limiting factor in regard to the punching rates obtainable. Compensation or avoidance of such effects are non-trivial. While mechanical damping is somewhat effective in reducing rebounding, in practice, it merely allows increase in speed until deleterious effects of the rebounding motion are again encountered. Such mechanical damping often does not produce substantial gain in punching rates and the extent to which it can be applied is limited since mechanical damping causes significant punch speed reduction during the return stroke and thus increases the total time duration of a single punching operation.

SUMMARY OF THE INVENTION

It is therefore an object of the present invention to provide a dynamic damping arrangement in order to avoid causing uncontrolled punch motion at high speeds and punch rates.

It is another object of the invention to provide a magneto-repulsion punch drive arrangement capable of operating at speeds not previously attainable.

It is a further object of the invention to provide a punching arrangement for producing holes for vias which are of high geometrical accuracy and operable at high speeds and punching rates without engendering damage to or defects in a workpiece.

It is yet another object of the invention to provide a technique of monitoring punch motion during operation of the punch apparatus in order to optimize punching rates and also provide mechanical diagnostics for the punch apparatus.

In order to accomplish these and other objects of the invention, a method is provided for dynamically damping a magnetic repulsion mechanism having a primary stator coil and a mechanically damped movable member including a secondary coil coupled therewith, in which a driving pulse of a predetermined amplitude and pulse width causes initial movement of said movable member, comprising the steps of causing the movable member to rebound from other structure, and applying a damping pulse to said primary coil during the rebound of the movable member, whereby kinetic energy is removed from the movable member during the rebound.

In accordance with another aspect of the invention, a dynamically damped magnetic repulsion mechanism is provided including a mechanically damped movable member, an arrangement for applying kinetic energy to the movable member and for causing rebounding motion of the movable member, and an arrangement for removing kinetic energy from said movable member during a selected portion of the rebounding motion of said movable member.

In accordance with a further object of the invention, an arrangement is provided for monitoring relative motion between a primary coil and a secondary coil in a magneto-repulsion system including means forming a resonant circuit with said primary stator coil, means for applying an electrical signal to said resonant circuit, and means for detecting an envelope of a signal appearing at a node of said resonant circuit as the quality factor of said resonant circuit is changed by said relative motion between a primary coil and a secondary coil.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
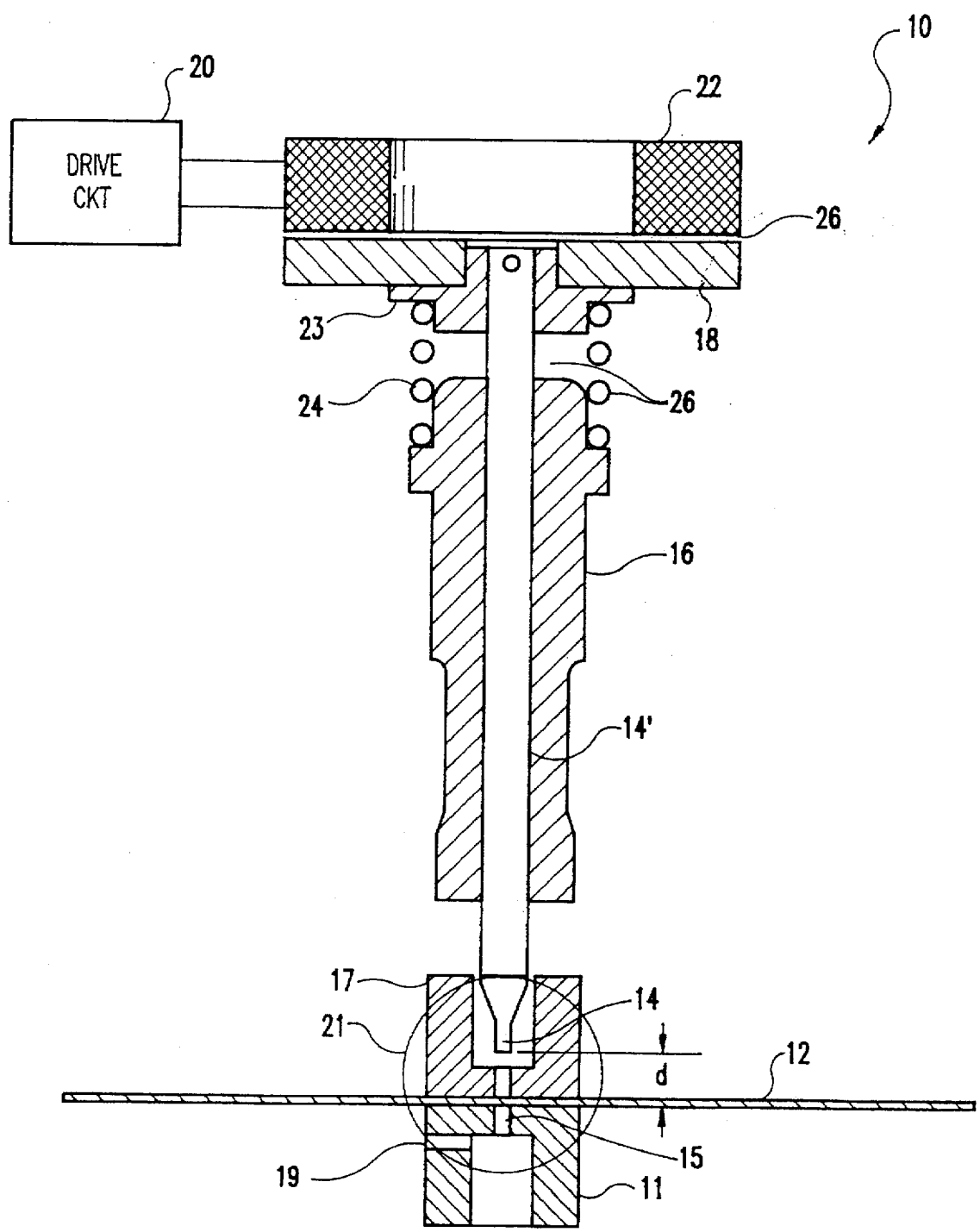
FIG. 1 is a cross-sectional view of an exemplary punch arrangement to which the invention may be advantageously applied.

Referring now to the drawings, and more particularly to FIG. 1, there is shown, in cross-section, a punching mechanism 10 to which the invention may be advantageously applied. This punching mechanism preferably includes a die 11 for supporting the workpiece which has an aperture 15 therein matching the diameter of punch tip 14. The punch tip 14 is preferably made from or coated with silicon carbide. This die 11 and the aperture 15 provides a cutting edge against which the punch tip 14 passes and further provides for control of the material 47 removed from the punched hole. Such material 47 may be disengaged from the punch tip 14 by an air jet applied at 19 within the die 11. The punch mechanism also preferably includes a stripper 17 for avoiding positional error of the punch 14 due to vibration or flexure of the punch body or looseness in guide (e.g. bushing) 16 through which the punch body 14' is reciprocated. Spring 24 is preferably provided to establish a rest position for the punch and to provide some clearance for relative motion (e.g. the downward stroke and close clearance 26) and to support the weight of the punch body and the annular disk 18. Spring 24 also assists in withdrawing the punch tip 14 from the punched material. However, at high punch rates the punch is preferably driven at velocities at which the punch body 14' will rebound from the stripper 17 with kinetic energy only slightly reduced from the downward stroke. In this operational regime, the forces applied by spring 24 may be neglected.

Drive for the punch body 14' and punch tip 14 is provided at the upper end of punch body 14' in the form of an annulus of conductive material 18, preferably copper. This annular disk 18 functions as a single turn winding of high conductivity when linked by a changing magnetic field produced by drive circuit 20 and stator coil 22, preferably formed as a multi-turn winding coaxial with annular disk 18 and the remainder of the punch mechanism 10. A magneto-repulsion action is produced when a rapidly changing current is applied to stator coil 22. Due to the close clearance 26, the magnetic field produced by stator coil 22 in response to an energizing pulse is closely coupled to the conductive annulus of annular disk 18, inducing a current therein by a transformer-like action. This current produces a magnetic field emanating from the annular disk 18 and of opposite polarity to the field emanating from stator coil 22. These two opposing magnetic fields produce a strong repelling force, causing the annular disk 18 and the attached punch 14 to accelerate away from the coils 22 at a rate of several thousand times the acceleration of gravity (several thousand G's).

It is important to recognize that this electro-magnetic repulsion mechanism is fundamentally different from a solenoid arrangement in which a force is exerted on a preferably ferromagnetic movable member in a direction tending to reduce the reluctance of the magnetic circuit resulting from energization of the coil. While a solenoid is capable of developing substantial force when the movable member is brought as close as possible to the coil and inductance is minimized, it is not as effective as the magnetic repulsion arrangement described above for producing large accelerations from narrow energization pulses. This is due, in large part, to the geometry of the respective mechanical systems since the attraction force developed by a solenoid decreases rapidly with separation of the movable member and the coil (e.g. maximum force is developed only when magnetic reluctance is minimized and no further movement in a particular direction is mechanically possible). The force developed by a solenoid is also limited by magnetic saturation. In contrast, the magnetic repulsion arrangement described above does not rely on ferromagnetic elements in a magnetic circuit but rather on a current induced in the highly conductive single turn secondary winding. The magneto-repulsion effect is the repulsion between two magnetic fields due to currents in the primary and secondary windings and is effective over a moderate separation of the primary and secondary windings corresponding to the ability to induce a substantial current in the secondary winding. Thus, over the displacement of the punch body 14' where driving and damping pulses are applied in accordance with the invention, substantial repelling forces can be generated. Therefore, high accelerations may be developed throughout the stroke and particularly the upper half thereof.

For short pulses, substantially less than the time constant determined by the inductances of the stator 22 and the annular disk 18, the kinetic energy imparted by the magneto-repulsion effect will be determined by the pulse width as well as the voltages applied. Therefore, in practice, a drive pulse of about 50 μs is generally used and the driving voltage is varied with the punching rate and the properties (e.g. thickness, resilience, tensile and shear strength, etc.) of the workpiece.

The close clearance 26 between the stator coil and the annular disk 18 also provides a significant degree of pneumatic damping. However, the close clearance which is required for such a function (e.g. little damping will be produced when the stator 22 and annular disk 18 are widely separated during the lower half of the downward punching stoke) limits the amount of allowable overshoot as the punch body 14' returns to its rest position. This limitation on punch position overshoot causes the rebounding and uncontrolled motion of the punch, referred to above.

Figure 2:
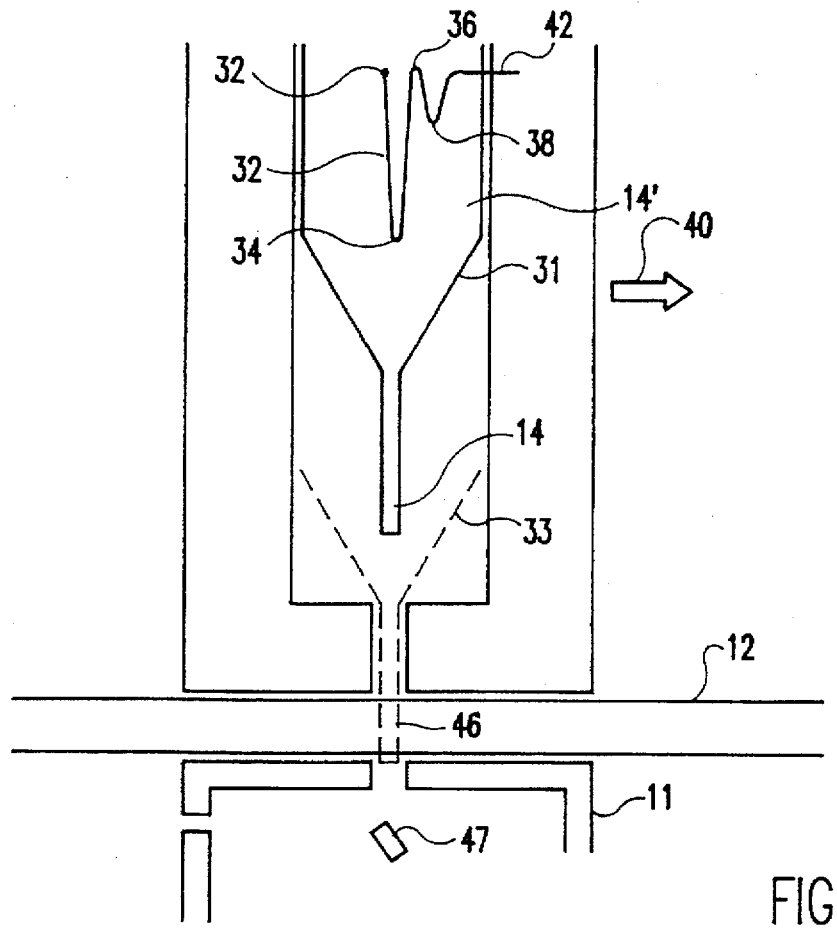
FIG. 2 is an enlarged view of a portion of FIG. 1.

The motion of the punch tip 14 is shown in enlarged form in FIG. 2, corresponding to the portion of FIG. 1 enclosed by circle 21. Picking an arbitrary reference point 30 on punch body 14' and recognizing that, during multiple punching operations, relative motion is provided between punch mechanism 10 and the workpiece (e.g. green sheet 12) in the direction indicated by arrow 40, reference point 30 will follow a path as illustrated, including points 32, 34, 36, and 38, collectively referred to as path 42. The downward punching stroke 32 carries the punch tip 14 from the position indicated at solid line 31 (e.g. the rest position) to the position indicated by dashed line 33 to punch a hole 46, bringing the reference point to position 34. The impact of the steel button 23 against the top surface of guide bushing 16 as well as the influence of spring 24 causes the punch to rebound upward to return toward the rest position 31, bringing the reference point to 36. The latter portion of this motion is damped mechanically by motion of the ambient atmosphere as annular disk 18 approaches stator winding 22 and overshoot is low. Nevertheless, at high punching rates, the compressibility of the ambient atmosphere as well as some degree of impact between the annular disk 18 and stator winding 22 causes a rebounding of the punch as shown by the position of reference point 30 at position 38. For purposes of illustration, it is assumed, as it is often observed at high punching rates, that this rebound motion is sufficient to bring punch tip 14 into a second contact with the workpiece 12. Due to the relative motion 40 during the upward stroke and rebound, punch tip 14 is no longer registered with the punched hole and contact between the punch tip and workpiece causes a dimple 44 as shown in further enlarged form in FIG. 3.

Figure 3:
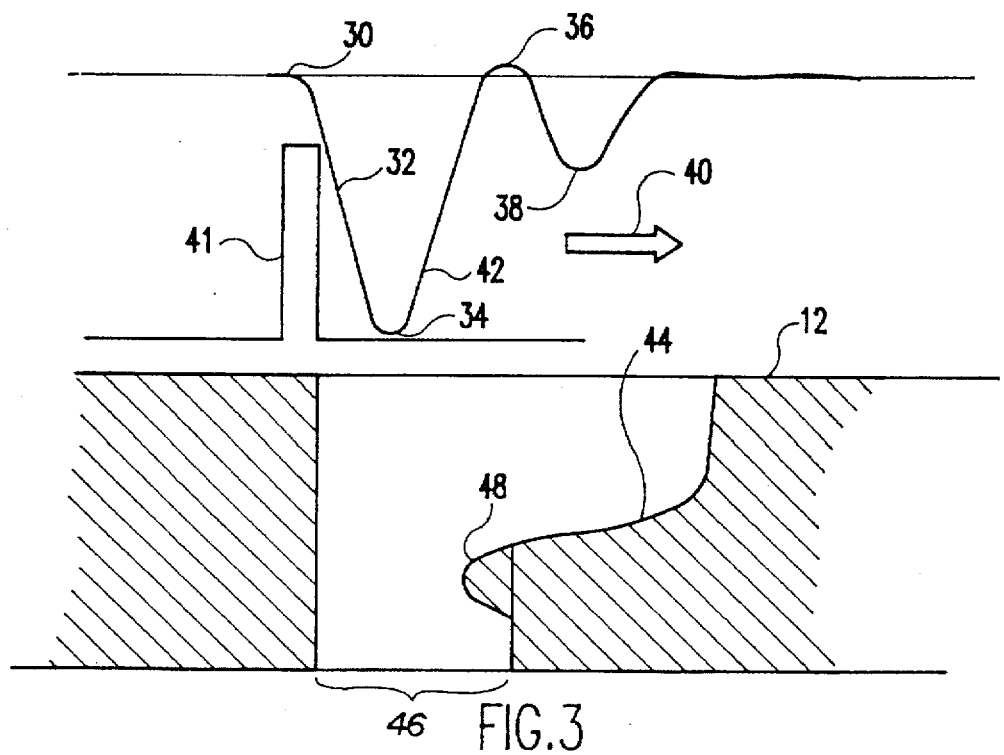
FIG. 3 is a cross sectional view of a green sheet exhibiting dimpling due to high speed punch operation without employment of the invention and corresponding electrical drive waveform and graphical depiction of punch motion.

In FIG. 3, the energizing pulse 41 causing motion through path 42 is shown superimposed thereon. As described above, this energizing pulse, applied to stator coil 22 causes a large downward stroke causing punching of hole 46 and ejection of slug 47 from the workpiece 12. However, the rebound stroke, from 36 to 38, causes the punch tip to be again driven against green sheet 12, forming dimple 44.

It can be readily appreciated from FIG. 3, which corresponds to actual photomicrographs of holes in green sheets, that the dimple, if filled with conductive material, causes the via to be much larger at the top than at the bottom. This is equivalent to misregistration of the green sheets when the MLC device is assembled and, if the conductors or vias are closely spaced, could cause shorting therebetween either on the same layer or an adjacent layer. It should be also noted in regard to the adjacent layers or lamina, that the possibility of shorting may be increased by slight and otherwise tolerable misregistration of green sheets when stacked for sintering or by unavoidable differential shrinkage of the green sheets during drying, curing and sintering processes. Therefore, dimples reduce manufacturing tolerances and/or manufacturing yields of devices so constructed.

Of somewhat lesser importance but still significant in regard to via formation and manufacturing yield is the deformation of green sheet material, as indicated at 48 as the dimple is formed. Since the volume of the dimple is not cut away from the green sheet, the material is deformed principally into the previously punched hole and thus reduces the cross-sectional area of the hole 46. This constriction of the hole not only increases the resistance of the via at a relatively localized position, maximizing deleterious thermal effects in operation of the device so formed, but may impede the extrusion of conductive material into the hole, resulting in defective via formation.

Figure 4:
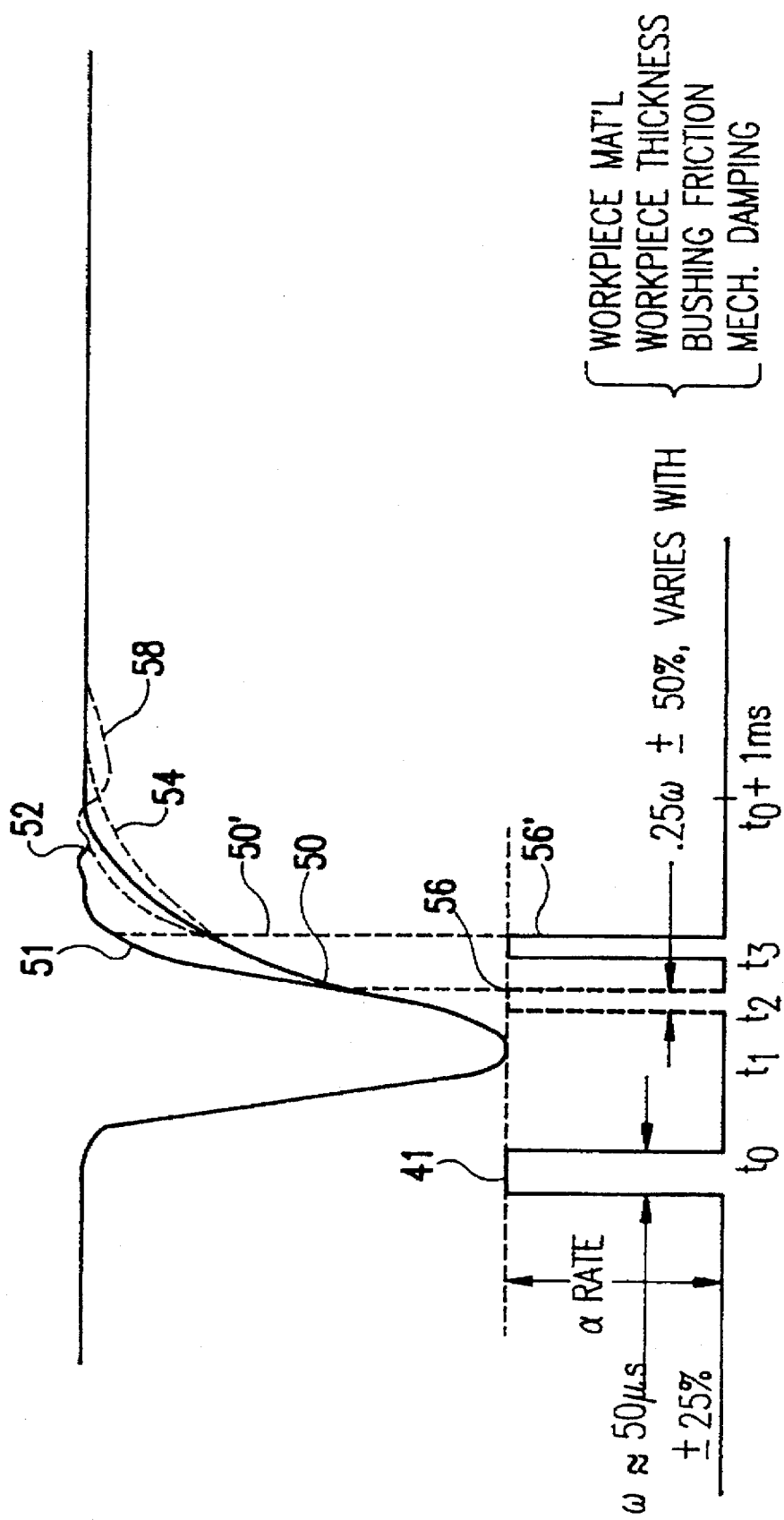
FIG. 4 is a graphical depiction of dynamic damping in accordance with the invention.

Referring now to FIG. 4, the dynamic damping technique in accordance with the invention will be explained. As indicated above, the problem arises from the velocity of the punch body 14' during the return stroke. Simply put, the inventors have discovered that a second pulse related in waveform to the initial drive pulse and applied during the return stroke can be used to remove kinetic energy from the punch body to a degree that the system will be sufficiently damped and the rebound can be either eliminated or sufficiently reduced that dimpling is avoided. It has been empirically determined that a damping pulse 56 of the same amplitude (for circuit simplicity) and about 25% of the width of the driving pulse 41 will avoid the dimpling effect if applied at a point in the last 50% of the return stroke (shown in dashed lines) and preferably in the last 10% of the return stroke, shown at 56'. This can be readily understood since, if the dynamic damping pulse 56 is applied earlier, but, of course, subsequent to the punching (e.g. between $t_1$ and $t_2$), magnetic coupling will be reduced. Also, the system speed will be drastically reduced since the duration of the return stroke will be increased by reduced punch speed over the remainder of the return stroke. If the dynamic damping pulse 56 is applied later (e.g. between $t_2$, corresponding to the mid-point 50 of the return stroke and $t_3$, the last 10%, 50', of the return stroke), the deceleration must be greater but mechanical damping, which begins to take significant effect at about $t_2$, can be effectively utilized. However, this increase in required dynamic damping pulse energy is partially offset by the increase in magnetic coupling efficiency due to the increased proximity of the stator 22 and annular disk 18. Therefore, timing is regarded as not particularly critical to the practice of the invention, but best results will be obtained if the dynamic damping pulse is applied after the mid-point of the return stroke. It should also be noted in this regard, that as the damping pulse is applied later in the return stroke, the velocity of the punch 14 will remain high, as shown at 51 for a damping pulse applied at $t_3$ (the beginning of the last 10% of the return stroke) of FIG. 4, for a longer period of time. Therefore, the overall punching cycle time will be reduced and higher punching rates may be achieved. Accordingly, applying the dynamic damping pulse in the last 10% of the rebound stroke is considered to be preferred.

Similarly, in the practice of the invention, the accuracy of the energy of the dynamic damping pulse is not particularly critical. Since fairly substantial clearance is provided between the rest position of the punch tip 14 and the workpiece 12, it is not necessary to completely avoid the contact of annular disk 18 and stator coil 22 (or other portion of the punch mechanism 10) but only that the rebounding motion be less than the clearance shown at d of FIG. 1. Therefore, there is substantial tolerance of actual energy applied both below the optimum energy applied at the preferred point 50', which would result in underdamping, as shown by punch reference point path 52 and overdamping, shown by reference point path 54. However, it should be noted that underdamping is preferable to overdamping since overdamping increases the duration of the return stroke, as noted above in regard to early application of the dynamic damping pulse. Further, the amount of energy absorbed by the punching action, itself, will vary somewhat from hole to hole and exact compensation is not to be expected. It is sufficient, therefore, that the invention provides substantial working tolerances so that reliably accurate punching may be done at rates somewhat exceeding one thousand holes per second (the time reference $t_o + 1$ msec. is indicated in FIG. 4).

Accordingly, the invention may be practiced by providing for a nominal damping pulse of the same amplitude as the driving pulse and a nominal fraction of the pulse width of the driving pulse with some degree of adjustment for the amount of punch kinetic energy used in the punching of the workpiece. As a practical matter, friction of the bushing 16 can generally be considered as a constant and, at high punching rates and punch speeds and accelerations, the action of the spring 24 may be neglected. If such an adjustment for punching energy is provided, the adjustment may be easily made by observing the motion of the punch body audibly or with a transducing arrangement (e.g. a light source cooperating with the movable punch body or attached thereto and an optical motion detector and oscilloscope to provide a time-expanded image of punch body motion) and adjusting the system to an operating point where contact between annular disk 18 and stator 22 begins to occur. This point will allow the maximum average operational speed of the punching system and provide maximum working tolerance on either side of the operating point.

Figure 5:
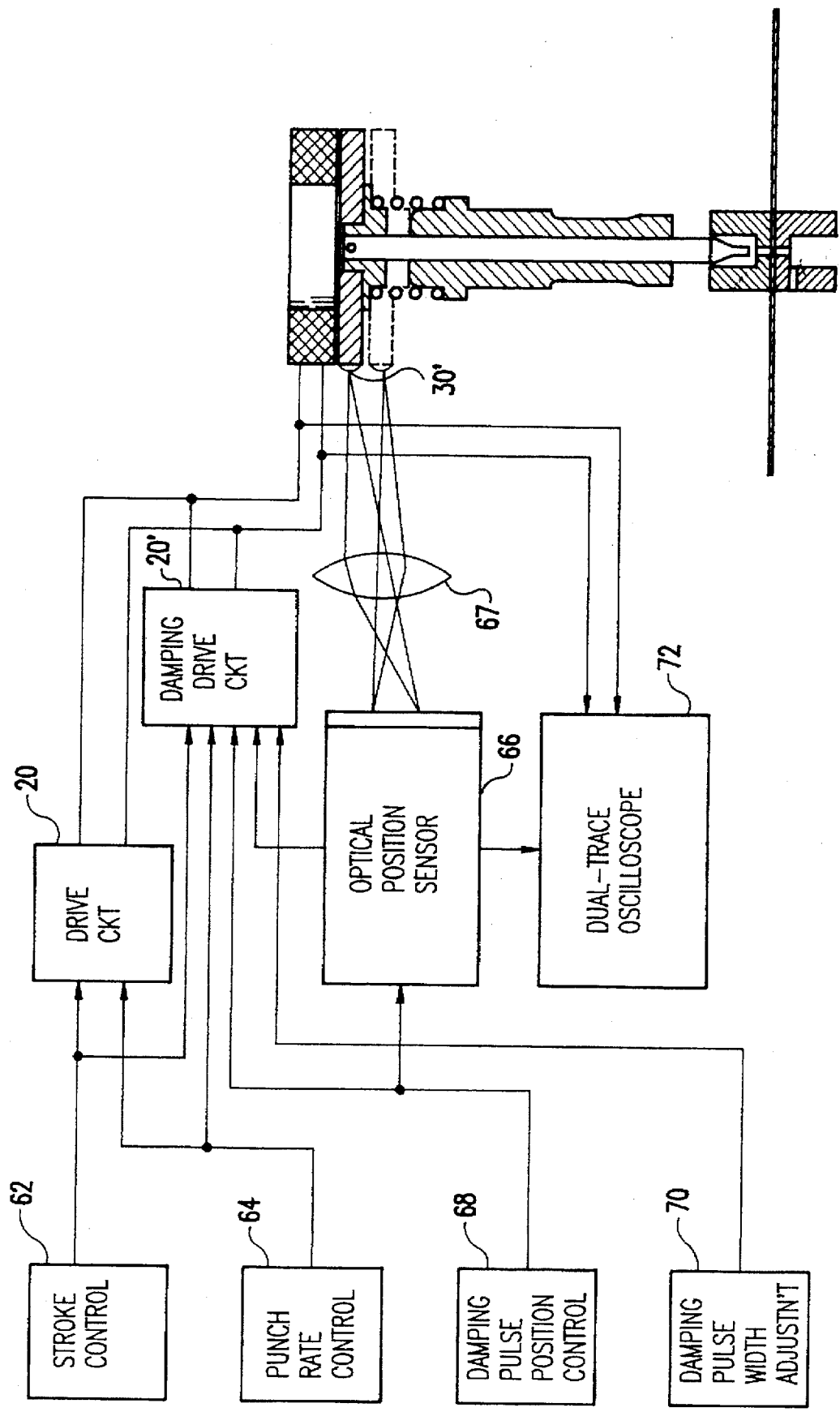
FIG. 5 is a schematic diagram of an electrical drive arrangement including dynamic damping in accordance with the present invention

Referring now to FIG. 5, the apparatus in accordance with the invention is shown in schematic form as added to the arrangement of FIG. 1. A stroke control 62 and punch rate control 64, omitted from FIG. 1 in the interest of clarity are also shown. However, it is to be understood that other elements of the punch drive system not necessary to an understanding of the invention remain omitted from FIG. 5 in the interest of clarity.

Stroke control 62 is provided for adjustment of the width of the drive pulse 41 in order to impart sufficient kinetic energy to the punch body 14' to achieve a cleanly punched hole in the workpiece. Punch rate control 64 determines the interval between drive pulses. Punch rate control is also used to correspondingly adjust the amplitude of the driving pulse in order to achieve some degree of rebounding from the downward punch stroke to increase speed of operation. (As noted above, spring 24 is of only marginal assistance in withdrawing the punch from the workpiece except at low punching energy.) Of course some mixing of these controls could be provided such that both controls affect both amplitude and width of drive pulse 41. It should be noted that drive circuit 20, which actually produces drive pulse 41 is essentially formed by two one-shot or trigger circuits and an amplifier. One of the two one-shot circuits will establish the interval between drive pulses 41 and the other one-shot circuit will determine drive pulse duration to terminate the pulse at a predetermined time after the drive pulse is initiated. The amplifier gain will determine the amplitude of the drive pulse. Voltage control of such circuits including the provision of non-linear transfer functions (e.g. to provide a predetermined and potentially non-linear relationship between punching rate and drive pulse amplitude) is within the purview of those skilled in the art in light of this disclosure.

To practice the invention in this environment, the same control signals are provided to a damping drive circuit 20' preferably included, for circuit simplicity, within drive circuit 20 since the same amplifier can be used to provide the same pulse amplitude. The damping drive circuit also essentially comprises two one-shot circuits functioning identically to those of drive circuit 20 except that one will be arranged to produce a nominal pulse width of about 25% of the pulse width produced by drive circuit 20. The other one-shot circuit is arranged to control initiation of the damping pulse at a controllable time after either the drive pulse, preferably at or a controllable period after the punch body reaches a predetermined position (e.g. the last 10%) of the return stroke.

For this purpose, optical position detector 66 and an optical system 67 is shown for providing a signal to establish timing of the damping pulse. Pulse position control 68 is provided to provide control of a delay of the pulse subsequent to the signal from the optical position detector 66. Provision of such a control may facilitate the physical placement of portions of the transducer system, particularly if an optical system is used. Damping pulse width adjustment 70 is used to provide a fine adjustment of damping pulse width. However, this control is neither critical nor necessary to the practice of the invention. The transmission of light from a reference point may be done by attachment of a small light source such as a bulb or light-emitting diode to any convenient point of the movable member including the annular disk 18 and the punch body 14', as generally indicated at 30'. However, other optical arrangements are preferred due to the high accelerations, such as transmission of light through a similarly located aperture or reflection, such as with a mirror or retroreflector. A trace such as that of FIG. 4 has also been obtained by projecting a light beam between stator 22 and annular disk 18 which then acts as a variable aperture, indicating or monitoring punch position by the amount of light transmitted through the gap, if any, at a given instant. A similarly operating variable aperture could effectively be formed by a reflector on the lower side of the annular disk 18 or on any portion of the moveable punch member which moves into and out of a light beam over the range of travel of the punch body 14'.

Figure 6:
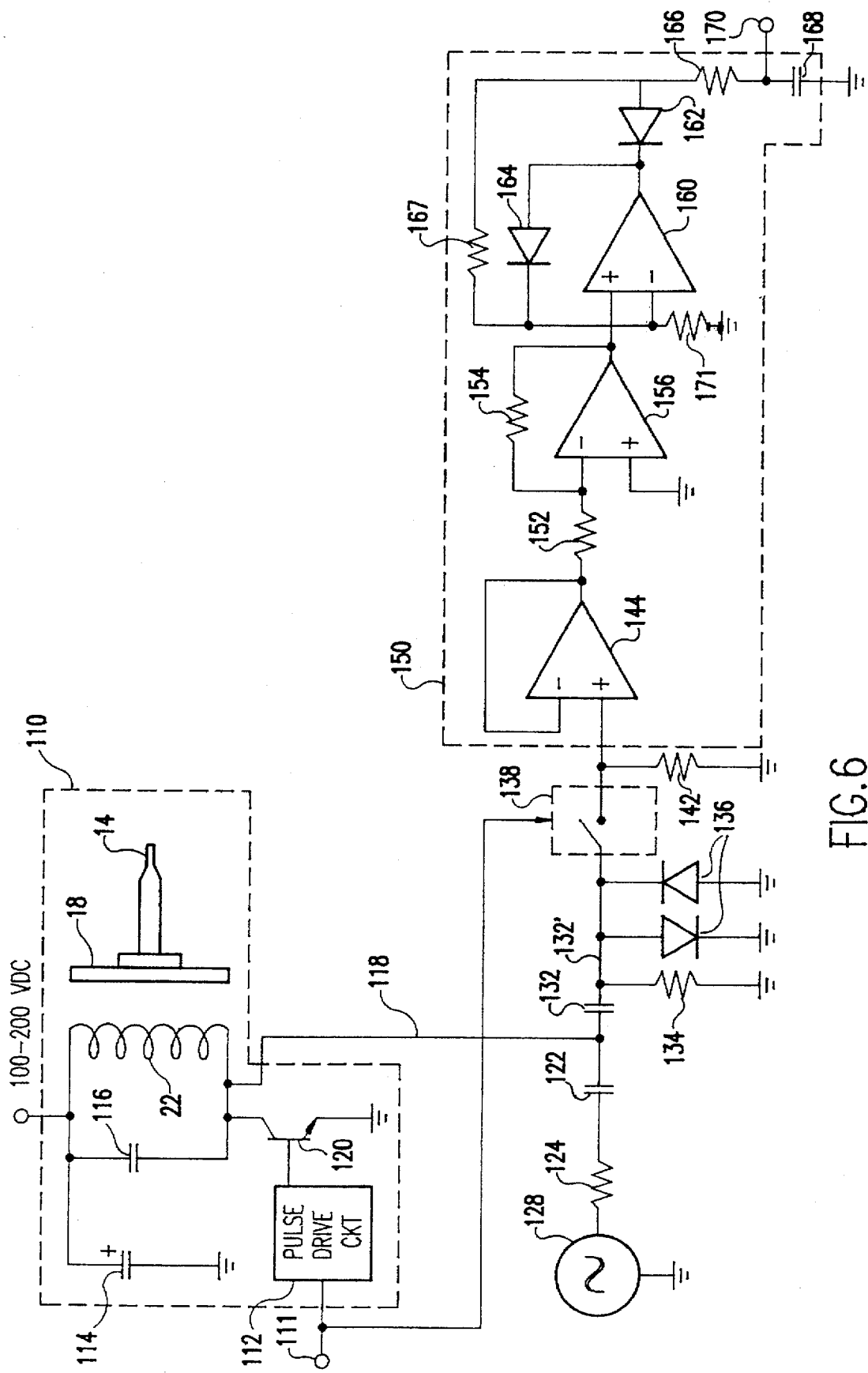
FIG. 6 is a schematic diagram of a preferred circuit arrangement for monitoring punch motion.

Another transducer arrangement which is presently preferred operates by reflected inductance at radio frequencies and will now be discussed with reference to FIGS. 6–10. An overall schematic circuit diagram of the punch drive and radio frequency reflected inductance transducing circuit is shown in FIG. 6. Drive circuit 20 and damping drive circuit 20' (FIG. 5) are collectively enclosed by dashed line 110. For simplicity, it is assumed in this illustration that the punch drive signals and damping drive signals are appropriately generated and applied to a collective pulse drive circuit 112 at terminal 111. Drive circuit 112 includes various amplifier stages for controlling a high voltage, high current transistor 120, capable of controlling 100 to 200 volts at currents of approximately 1000 Amperes through coil 22 and parasitic capacitance 116. (In practice, a small additional capacitance of several hundred picofarads is added at 116 to mask variation in collector capacitance with voltage of transistor 120.) The development of such a high current for the brief period of a driving or damping pulse is facilitated by the use of a large storage capacitor 114.

For monitoring punch position, it has been found that by providing a small capacitor 122 and a resistor 124 in series with coil 22 (and storage capacitor 114, which has negligible effect at high frequencies) over connection 118, a series resonant circuit can be formed and driven at or near a resonant frequency by radio frequency (RF) generator 128 with no effect on the punch 14 or its associated drive circuitry 110. Recalling that the coil 22, in combination with annular disk 18 functions as a transformer, the inductance of coil 22 will vary slightly with the coupling and current induced in the annular disk 18, which, in turn, varies with the separation therebetween. Thus, if the frequency of the RF generator 128 is set to the resonant frequency of the parallel resonant circuit consisting of capacitor 116 and the capacitance of transistor 120 and the coil 22 at a particular separation of the annular ring 18 from coil 22 (preferably at maximum punch travel), the quality factor or Q of the circuit will be changed when the annular disk is displaced and the particular reference separation is changed (e.g. annular disk 18 moved closed to coil 22). While the relatively short travel of punch 14 is insufficient to accurately monitor punch position at high resolution with other electrical techniques, the peak-to-peak voltage change of the RF signal at node 118 will vary by 20% or more, allowing accurate measurement of position.

Figure 7:
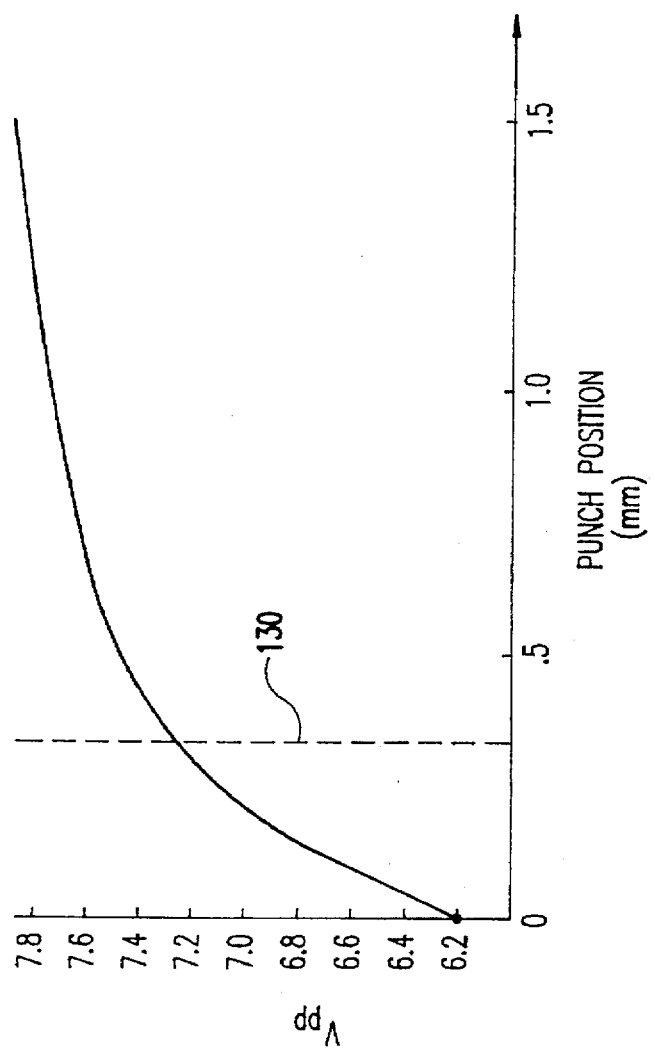
FIGS. 7 and 8 are graphs useful for explaining the operation of the circuit arrangement of FIG. 6, and FIGS. 9 and 10 are profiles obtained in the same manner as FIG. 8 using the circuit arrangement of FIG. 6 which are indicative of different modes of punch operation or malfunction.
Figure 8:
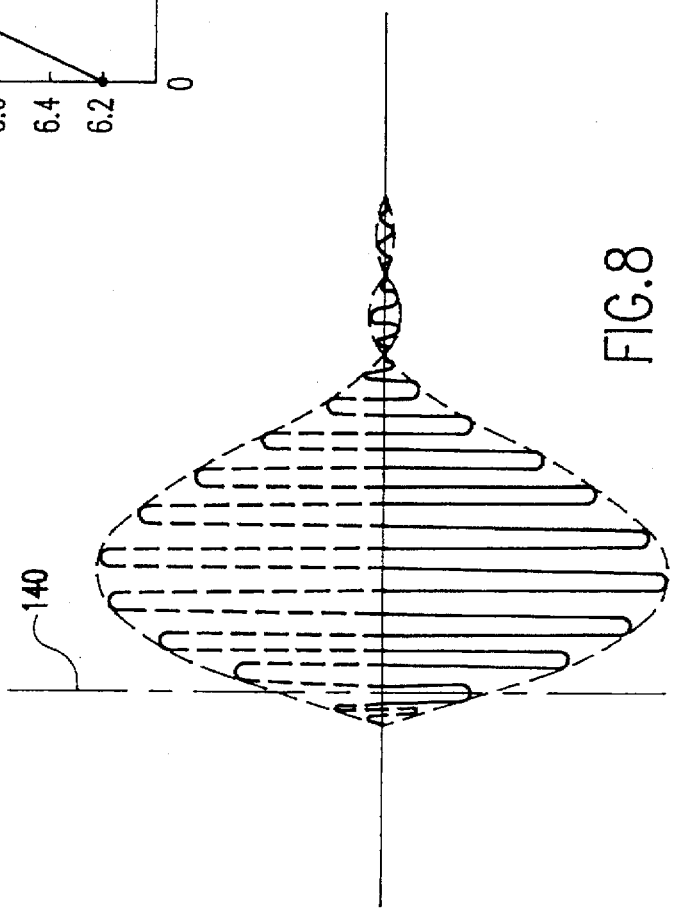

This variation of peak-to-peak voltage, $V_{pp}$, is plotted as a function of separation of coil 22 and annular disk 18 in FIG. 7 (e.g. punch position). To the right of dashed line 130 (generally corresponding to the rest position of the punch), the variation is relatively linear. Thus, when the punch is operated, the voltage at node 118 will be a radio frequency sine wave having an envelope, over time, determined by the variation, with time, of the punch position, as illustrated in idealized form in FIG. 8 (except that the radio frequency waveform should be of much higher frequency than depicted to more fully define the envelope). In practice, the non-linearity of FIG. 7 causes the envelope to have a somewhat more pronounced peak which assists in observation of the desired timing and correction of the non-linearity is therefore not generally desirable. An envelope detector 150 can therefore provide a voltage waveform which is accurately indicative of punch motion over time as the punch is operated. This waveform not only allows correct timing of the dynamic damping pulse, described above, but is also useful in providing diagnostics of the punch apparatus.

In a preferred embodiment of the invention, a protective circuit is provided between node 118 and the envelope detector 150. This protective circuit includes several parts including a capacitor for AC coupling and blocking the high DC voltage which will appear on node 118 when transistor 120 is turned off. Further, to attenuate voltage spikes which occur at the instant of turn off of transistor 120, the output side (e.g. node 132') of capacitor 132 is clamped by a pair of oppositely poled diodes 136. Node 132' is referenced to ground by resistor 134. As further protection, analog switch 138 is also provided to open the circuit during the duration of the punch drive pulse 41 and, if desired, damping pulse 56, 56' (FIG. 4), as well. The envelope detector circuit is connected to receive an input during intervals of interest after the punch drive pulse, for example, the period subsequent to the time indicated by chain line 140 in FIG. 8.

The first stage of envelope detector 150 is preferably formed as a voltage follower amplifier stage 144 which provides current gain. This stage can be embodied and is depicted, for convenience, as an operational amplifier having direct feedback to the inverting input. Of course, other embodiments may be used since the particular implementation is not critical to the practice of the invention. If, however, an operational amplifier is used, as depicted, resistor 142 is necessary to provide base current to an input transistor at the non-inverting input thereof.

The second stage of the envelope detector 150 is preferably a voltage gain stage, preferably embodied with an operational amplifier 156 having voltage gain determined by resistors 152 and 154 as is well-understood in the art. Actual envelope detection is done by the following stage including a peak detector circuit formed by diode 162 and short time-constant RC circuit formed by resistor 166 and capacitor 168. This peak detector, by rectifying the RF signal also eliminates one half of the waveform appearing at node 118 (e.g. the upper half of FIG. 8, as indicated by a dashed RF waveform). A further operational amplifier 160 is used with diode 162 and diode 164 in the feedback circuit in a so-called ideal diode configuration to compensate for the inherent forward drop of diode 162. Resistors 167 and 171 determine the gain of this stage.

By allowing monitoring of punch movement during a very large portion of the punching cycle, the envelope detector in accordance with the preferred embodiment of the invention allows either automatic or manual adjustment of the punch drive circuitry to optimize punching for a wide variety of workpiece materials, thicknesses and hole diameters or any other parameters which affect the energy required for punching. In addition, the ability to monitor punch position as a function of time provides diagnostic information concerning punch operation, as will be discussed with reference to FIGS. 9 and 10.

Figure 9:
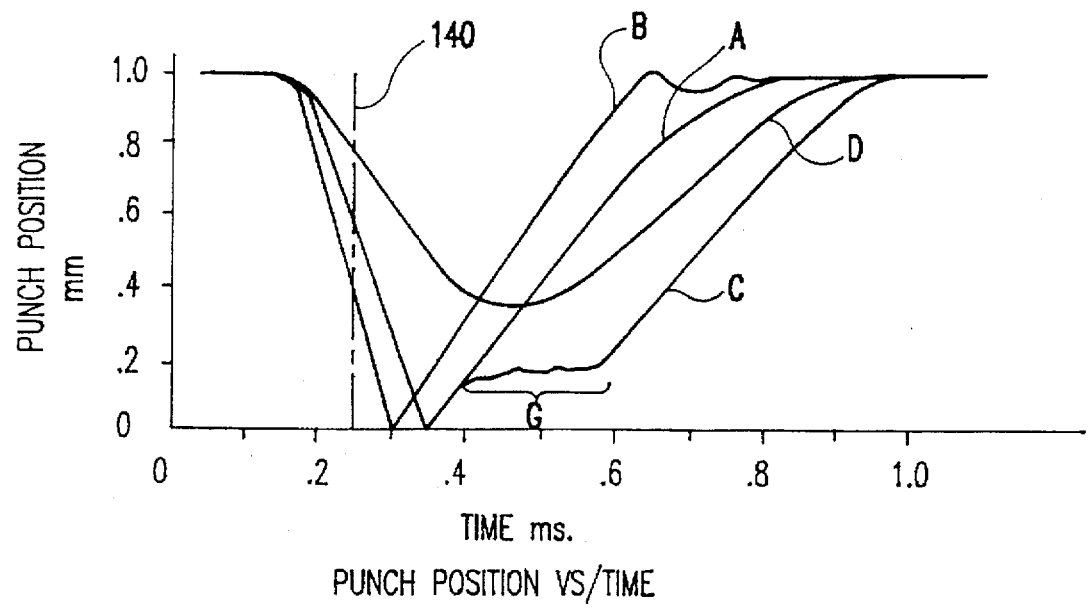
Figure 10:
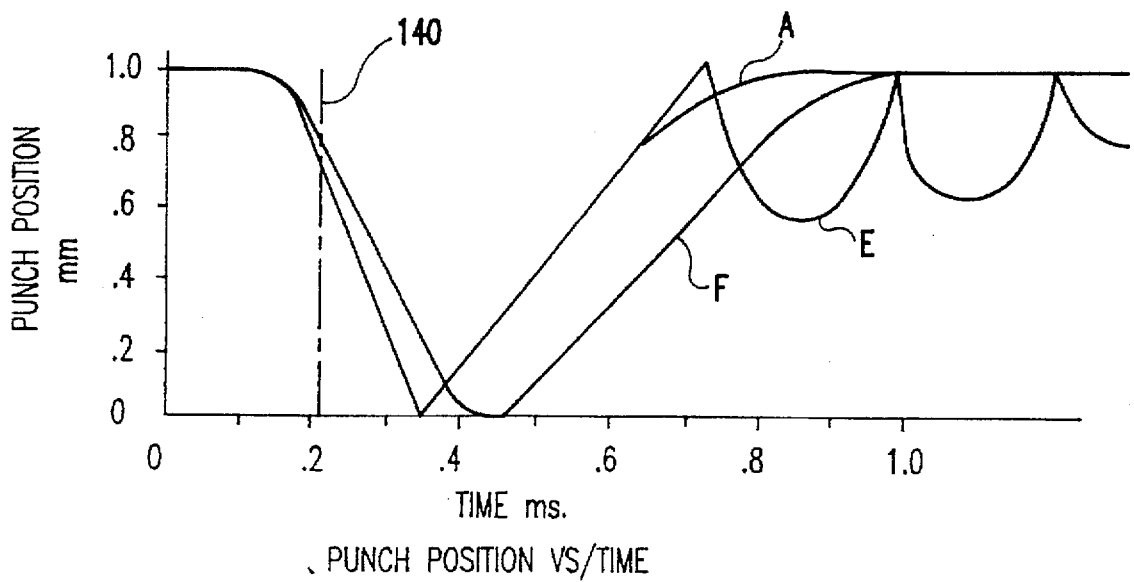

In both FIGS. 9 and 10, normal punching operation is depicted in waveform A although these waveforms indicate that increased speed of operation is possible without dimpling as depicted in waveform B in which rebound is evident but insufficient to bring the punch into a second contact with the workpiece, as discussed above with reference to FIG. 4. Several malfunctions of the apparatus can also be determined from the envelope shape. For example, waveform C represents a condition where the copper annular disk 18 is broken off from the punch shank 14' and tends to float more closely to the coil 22 after delivering kinetic energy to the punch shank until the punch shank rebounds. A similar but fluctuating pattern also indicates binding of the punch body 14' in guide bushing 16; the fluctuation being caused by shifting of dirt or other foreign matter which cause the binding. The length and position of segment G generally indicates sticking of the punch in the workpiece. Low drive power is indicated by waveform D. One or more shorted turns of coil 22 may appear similar (e.g. in the time shift of the peak) to waveform D if insufficient punching energy resulted (from a reduced number of ampere-turns) but may also include a general downward shift of the waveform due to the reduced Q of the resonant circuit. An open coil 22 would interrupt the resonant circuit and be represented by a nearly flat response, as would a punch stuck in the down position (but at a different near constant envelope voltage).

The punch position monitoring arrangement can also reveal other mechanical damage to the punch apparatus such as bent or distorted punch heads which result in the characteristic pattern shown at E of FIG. 10. Further, empirical data regarding the workpiece can be obtained by monitoring the energy or punch drive power level necessary to achieve a full stroke through the workpiece, as shown at F of FIG. 10 (where the rounded peak indicates that rebounding is not occurring although full envelope amplitude is obtained.

It should also be noted that the preferred RF reflected inductance position transducer described above is somewhat more sensitive than other transducing arrangements and, since it directly monitors the position of the annular ring 18, is capable of producing more diagnostic information than other transducer arrangements. For example, optical transducing of punch body position would not reveal detachment of the annular ring 18 from the punch body. Further, due to the non-linearities of the RF reflected inductance transducer arrangement in comparison with, for example, optical or capacitive transducers, diagnostic information appearing in waveforms such as waveform C of FIG. 9 and waveform E of FIG. 10 can be more readily resolved and interpreted. At the same time, the response of the RF reflected inductance transducing arrangement is sufficiently linear to be readily understood by an operator and related to the actual punch movement.

While a capacitive analog of the RF reflected inductance sensing of punch position is theoretically possible, as a practical matter it would differ in several significant ways and therefore is not preferred. Most evidently, the punch structure and all electrical components in the drive and sensing circuit all have parasitic capacitances to ground which are significantly large in comparison to the capacitance between the coil 22 and the annular disk 18. Further, the inductance of coil 22 is sufficiently large to prevent resonance at a frequency where significant variation in peak-to-peak voltage could be detected, even with the formation of a relatively large capacitor having at least one plate isolated from ground (which would, itself be difficult due to the difficulty of forming a reliable connection or electrical isolation between punch shaft 14' and bushing 16 and the air dielectric of such a capacitor). Thus, a separate tank circuit would be required including an additional coil and attachment of additional capacitor structure to the punch, increasing its mass. Correspondingly, the coil 22 would be taken out of the sensing circuit and malfunctions involving coil 22 could not be sensed. In contrast, the preferred RF reflected inductance sensing requires no mechanical or electrical changes to the punch drive circuit and does not affect the operation of the punch in any significant way.

As noted above, neither of controls 68 and 70 are considered necessary to the successful practice of the invention. However, of these two controls, damping pulse width control 70 is more likely to be useful during operation of the invention in order to compensate for a range of energies absorbed during the punching operations. However, as a practical matter, the punch rate and stroke controls will generally be set with respect to the properties of the workpiece material so that the kinetic energy of the punch body 14' will be about the same during the upward portion of the stroke, regardless of the punching energy required. That is, the energy dissipated in the workpiece should be small in comparison to the energy imparted to the punch by the drive pulse and transferred to the upward portion of the stroke by the elastic rebound of the punch. Damping pulse position control 68 could also be used if the desired point of the upward stroke could not be monitored or observed due to the geometry of the punching mechanism 10 and or to provide a fine control over the position detected by optical position sensor 66. If either of these controls 68, 70 are provided, adjustment is preferably done by observing motion of the punch body 14' by means of an oscilloscope 72 (preferably of the dual trace type) displaying the sensed punch position in accordance with any of the above transducer arrangements described above which will produce a display of waveforms similar to that of FIGS. 4, 9 and 10 and the amplitude of the rebound motion 58 directly observed during adjustment of the system.

While not considered necessary to the successful practice of the invention, the dynamic damping could, of course be more rigorously determined and/or more closely controlled. Specifically, the kinetic energy of the punch body 14' during the upward stroke will be determined by the kinetic energy of the downward stroke, less the energy absorbed during the punching operation, the friction in bushing 16 and the adiabatic and non-adiabatic air losses in the pneumatic damping provided by the annular disk 18 and stator 22 because all other interactions involved in the rebound of the punch body 14' are substantially elastic. Both friction and air losses can be integrated over a full stroke and this integrated value is substantially constant for a given punching rate. Therefore, if the shear and tensile strength of workpieces is relatively consistent, the damping pulse width would vary inversely with workpiece thickness at a given punch rate. Similarly, punch body velocity and accelerations vary with punching rate and therefore the velocity of punch body 14' during the upward stroke varies with punching rate due to elastic rebounding of the punch body 14'. Therefore, it is possible to make alterations in the nominal damping pulse width based on these two parameters from a nominal value corresponding to the relatively constant bushing friction and air losses. Nevertheless, it is considered to be both more convenient and more accurate to merely adjust so much of the arrangement of FIG. 5 as is provided based on observation of system performance. This is particularly the case as punching rates are maximized at rates substantially exceeding those which could heretofore be obtained with good hole quality. In this latter regard, it should be appreciated that the dynamic damping pulse width or amplitude can be increased as far as may be practical with desired increases in punching rates in order to remove excess kinetic energy from the punch body 14' during rebound from the punching operation. Therefore, the major remaining limitation on punching rates lies in the duration of damped punch body motion after the dynamic damping pulse is applied. Since the dynamic damping pulse can compensate for some reduction in mechanical damping and since some degree of underdamping is tolerable, two to five fold increases in punching rates are obtainable due to the meritorious effects of the present invention.

In view of the foregoing, it is seen that a simple arrangement has been provided which can eliminate dimpling of a workpiece during punching operations while substantially increasing the rate at which punching operations can be performed. High accuracy and excellent consistency of hole position and geometry are obtained and maximum punching rates can be substantially extended in practical applications.

While the invention has been described in terms of a single preferred embodiment, those skilled in the art will recognize that the invention can be practiced with modification within the spirit and scope of the appended claims. For example, more than a single dynamic damping pulse could be applied by simple extension of the inventive concepts outlined above. In such a case, differing pulse widths and amplitudes of damping pulses could be employed to essentially halt motion of punch body 14' at or very near the rest position.

Having thus described my invention, what I claim as new and desire to secure by Letters Patent is as follows:

1. An apparatus for monitoring relative motion between a primary stator coil and a secondary movable coil in a magneto-repulsion system having a pulsed current source for generating a magnetic field from the primary stator coil to thereby induce a current in the secondary movable coil to emanate an opposing magnetic field therefrom and thereby cause motion thereof, comprising:

means for forming a resonant circuit with the primary stator coil having a quality factor which varies non-linearly relative to a position of the secondary movable coil along a direction of the relative motion, said means comprising a resistor and a capacitor connected in series with the primary stator coil, and an output node connected to the primary stator coil;

means for applying an electrical signal having a predetermined radio frequency to said resonant circuit;

a switch having an input coupled to said output node, and having an output, and having a means for disconnecting said input from said output while the pulsed current source energizes the primary stator coil; and means for detecting at said output of said switch an envelope of a peak-to-peak voltage of a signal at said predetermined radio frequency received by said switch from said output node of said resonant circuit and having means for outputting an envelope signal representative of said envelope voltage.

2. An apparatus according to claim 1, further comprising a protective clamp circuit means for preventing a voltage above a predetermined absolute value from being received by said means for detecting an envelope of a peak-to-peak voltage signal.

3. An apparatus according to claim 1, further comprising a means for generating a position-versus-time plot image of said relative motion between said primary stator coil and said movable secondary coil in accordance with said envelope signal output of said means for detecting a peak-to-peak voltage.

* * * * *